United States Patent
Son et al.

(10) Patent No.: US 7,589,405 B2
(45) Date of Patent: Sep. 15, 2009

(54) MEMORY CARDS AND METHOD OF FABRICATING THE MEMORY CARDS

(75) Inventors: Min-Young Son, Chungcheongnam-do (KR); Woo-Dong Lee, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 11/286,058

(22) Filed: Nov. 23, 2005

(65) Prior Publication Data

US 2006/0116014 A1 Jun. 1, 2006

(30) Foreign Application Priority Data

Nov. 27, 2004 (KR) .................. 10-2004-0098367

(51) Int. Cl.
*H01L 23/02* (2006.01)
(52) U.S. Cl. .................................... 257/678
(58) Field of Classification Search ......... 257/678–679, 257/787, 723
See application file for complete search history.

(56) References Cited

U.S. PATENT DOCUMENTS

| | | | | |
|---|---|---|---|---|
| 5,355,016 A * | 10/1994 | Swirbel et al. | ............... | 257/659 |
| 5,365,655 A * | 11/1994 | Rose | ............... | 29/827 |
| 5,708,304 A * | 1/1998 | Tomita | ............... | 257/778 |
| 6,191,360 B1 * | 2/2001 | Tao et al. | ............... | 174/522 |
| 6,365,979 B1 * | 4/2002 | Miyajima | ............... | 257/787 |
| 6,867,480 B2 * | 3/2005 | Legaspi, Jr. et al. | ............... | 257/659 |
| 7,078,794 B2 * | 7/2006 | Lee | ............... | 257/687 |
| 7,239,029 B2 * | 7/2007 | Bolken et al. | ............... | 257/787 |
| 2003/0209793 A1 * | 11/2003 | Nishizawa et al. | ............... | 257/679 |
| 2004/0119173 A1 * | 6/2004 | Bolken et al. | ............... | 257/787 |
| 2006/0042827 A1 * | 3/2006 | Chou et al. | ............... | 174/255 |

FOREIGN PATENT DOCUMENTS

| | | |
|---|---|---|
| JP | 2002-176066 | 6/2002 |
| JP | 2004-013738 | 1/2004 |

OTHER PUBLICATIONS

English language abstract of the Japanese Publication No. 2002-176066.
English language abstract of the Japanese Publication No. 2004-013738.

* cited by examiner

*Primary Examiner*—Phuong K Dinh
(74) *Attorney, Agent, or Firm*—Marger Johnoson McCollom, P.C.

(57) ABSTRACT

Provided are a memory card and a method of fabricating the memory card. The memory card includes: a printed circuit board including conductive wires exposed to at least a portion of an outer wall of the printed circuit board; at least one electronic device mounted on the printed circuit board; and a molding part sealing the at least one electronic device on the printed circuit board and the conductive wires exposed to the outer wall of the printed circuit board, and simultaneously exposing at least a portion of the outer wall of the printed circuit board.

32 Claims, 5 Drawing Sheets

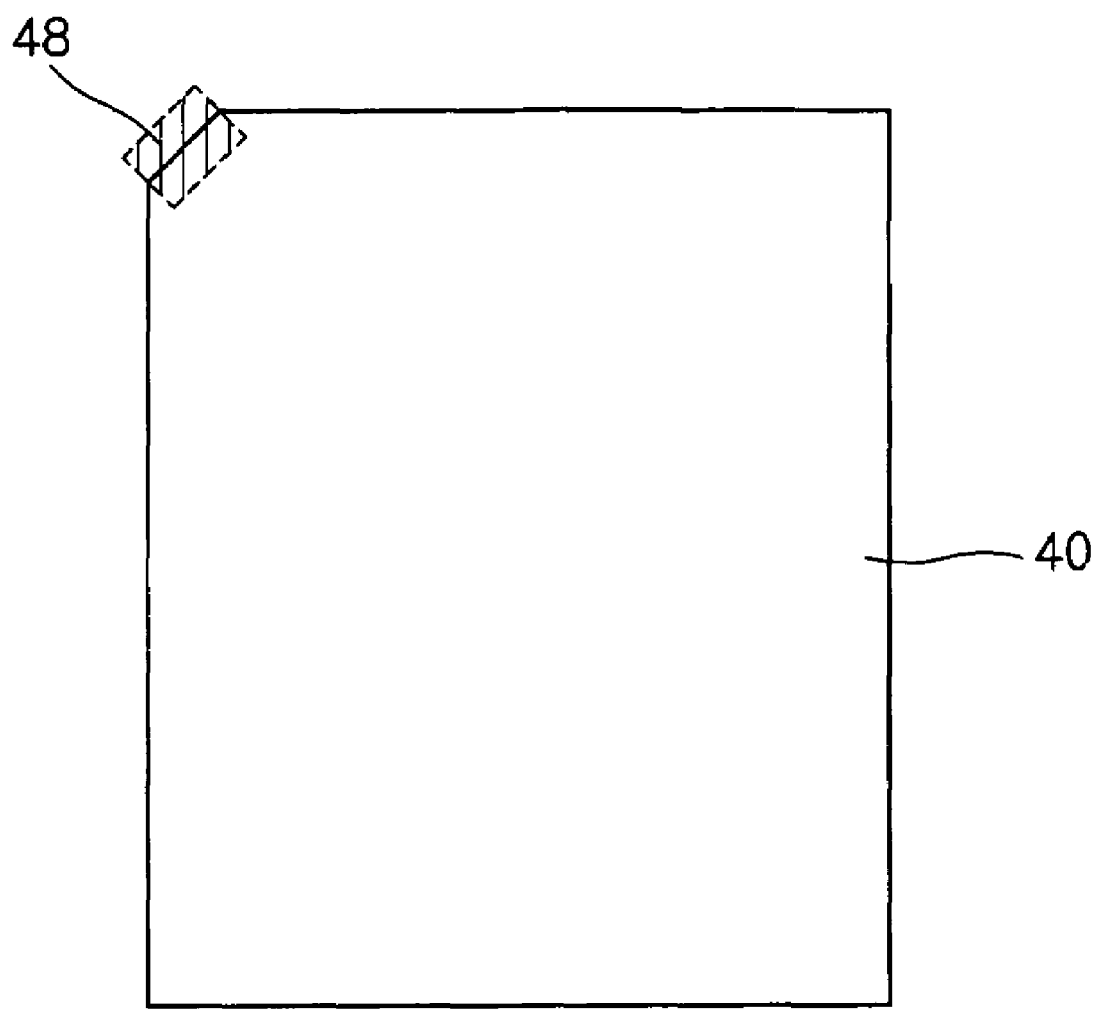

MEMORY CARDS AND METHOD OF FABRICATING THE MEMORY CARDS

CROSS-REFERENCE TO RELATED PATENT APPLICATION

This application claims the benefit of Korean Patent Application No. 10-2004-0098367, filed on Nov. 27, 2004, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a memory card used in a mobile product and a method of fabricating the memory card.

2. Description of the Related Art

With the recent development of mobile products, applications of memory devices have been expanded. In particular, memory cards are expected to be greatly developed and to be given a great deal of weight on new field of semiconductor industry. Institutional safeties have been provided to protect the copyright of software with the wide-range popularization and development of the Internet. Also, several types of memory cards have been developed so as to complement the security of the memory cards.

Several types of compact, light memory cards are currently used as data storage of multimedia. For example, multimedia cards (MMCs) are provided. In the MMCs, memory devices and control devices are mounted on printed circuit boards (PCBs) and electrically connected to the PCBs using wire-bonding and protected using molding and capping, to thereby interface with a host device using a small number of signals.

FIG. 1 is a cross-sectional view of a conventional lid type memory card. Referring to FIG. 1, a semiconductor chip 14 is mounted in a predetermined position of a PCB 10 via an adhesive part 12, and an external terminal of the semiconductor chip 14 is electrically connected to a specific circuit terminal formed in the PCB 10 via bonding wires 18. A passive device 16 is mounted in a specific position of the PCB 10 according to the design. The semiconductor chip 14 is mounted as an electronic device on the PCB 10. However, package type electronic devices may be mounted on the PCB 10. Alternatively, the semiconductor chip 14 and the package type electronic devices may be mounted on the PCB 10.

After a bonding process performed on the semiconductor chip 14 is finished, the semiconductor chip 14 or the passive device 16 is sealed by a sealing part 20 formed of a sealing compound. Thereafter, the semiconductor chip 14 or the passive device 16 is cut as individual memory cards and then finally capped with a lid 22 so as to be physically and chemically protected from the external environment.

The above-described lid type memory card requires a large number of fabricating processes. Thus, the lid type memory card increases cost and is poor in terms of the high integration of electronic devices.

FIG. 2 is a cross-sectional view of a chip scale package (CSP) type memory card. Referring to FIG. 2, unlike the conventional lid type memory card shown in FIG. 1, the lid 22 that is a final protecting structure is not formed. Thus, compared to the conventional lid type memory card, a number of fabricating processes is reduced. As a result, cost is reduced. However, an electrostatic discharge characteristic is deteriorated. In other words, to form the PCB 10, a copper foil is compressed on a side or both sides of an insulating plate formed of a phenol resin, an epoxy resin, or the like. Next, a pattern is formed depending on a designed circuit, and an unnecessary portion is eroded to remove the copper foil. Hole or viaholes are formed to electrically connect lids of several types of electronic products mounted on the PCB 10, and plating wires are formed. Here, the plating wires are exposed to the side of the edge of the PCB 10. When moisture exists among the plating wires exposed to the external environment, the moisture forms an electric conductive line. Thus, static electricity is discharged among the plating wires. As a result, an ESD characteristic is deteriorated.

SUMMARY OF THE INVENTION

The present invention provides a memory card removing a lid to reduce a number of fabricating processes, basically maintaining CSP type to minimize an effective area of a PCB, maximizing a space in which an electronic device is to be mounted to realize high integration, and preventing the deterioration of an ESD characteristic that is a problematic in a CSP type memory card and a method of fabricating the memory card.

According to an aspect of the present invention, there is provided a memory card including: a printed circuit board including conductive wires exposed to at least a portion of an outer wall of the printed circuit board; at least one electronic device mounted on the printed circuit board; and a molding part sealing the at least one electronic device on the printed circuit board and the conductive wires exposed to the outer wall of the printed circuit board, and simultaneously exposing at least a portion of the outer wall of the printed circuit board.

The printed circuit board may be square, and the conductive wires may be exposed to at least one side of the outer wall of the printed circuit board, at least one corner of the outer wall of the printed circuit board, or at least one side and at least one corner of the outer wall of the printed circuit board.

According to another aspect of the present invention, there is provided a memory card including: a printed circuit board including a main board, an upper photo solder resist formed on an upper surface of the main board, and a lower photo solder resist layer formed on a lower surface of the main board, a portion of the lower photo solder resist being removed by a predetermined width from an edge of a lower surface of the printed circuit board; at least one electronic device mounted on the printed circuit board; and a sealing part sealing the at least one electronic device on the printed circuit board and extending to fill the removed portion of the lower photo solder resist layer of the printed circuit board.

A whole portion of the lower photo solder resist layer may be removed by a predetermined width along the edge of the lower surface of the printed circuit board, or a portion of the lower photo solder resist layer may be removed by a predetermined width along the edge of the lower surface of the printed circuit board. The conductive wires may be exposed to a corner of an outer wall of the main board of the printed circuit board at the removed portion of the lower photo solder resist layer, and the molding part seals the conductive wires.

According to still another aspect of the present invention, there is provided a method of fabricating a memory card including: providing a printed circuit board comprising conductive wires exposed to at least a portion of an outer wall of the printed circuit board; mounting at least one electronic device on the printed circuit board; and forming a molding part sealing the at least one electronic device on the printed circuit board and the conductive wires exposed to the outer wall of the printed circuit board and exposing at least a portion of the outer wall of the printed circuit board.

According to yet another aspect of the present invention, there is provided A method of fabricating a memory card including: providing a printed circuit board comprising a main board, an upper photo solder resist layer formed on an upper surface of the main board, and a lower photo solder resist layer formed on a lower surface of the main board; removing the lower photo solder resist layer by a predetermined width from an edge of a lower surface of the printed circuit board; mounting at least one electronic device mounted on the printed circuit board; and forming a sealing part sealing the at least one electronic device on the printed circuit board and extending to fill the removed portion of the lower photo solder resist layer of the printed circuit board.

BRIEF DESCRIPTION OF THE DRAWINGS

The above and other features and advantages of the present invention will become more apparent by describing in detail exemplary embodiments thereof with reference to the attached drawings in which:

FIG. 11 is a schematic bottom view of a memory card according to yet another embodiment of the present invention;

DETAILED DESCRIPTION OF THE INVENTION

Figure 1:
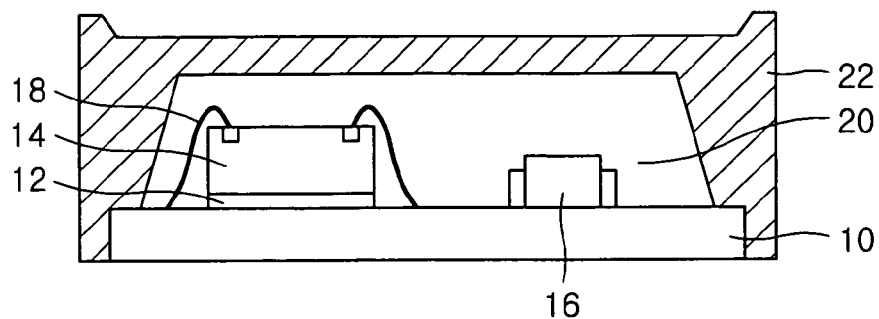
FIG. 1 is a cross-sectional view of a conventional lid type memory card.
Figure 2:
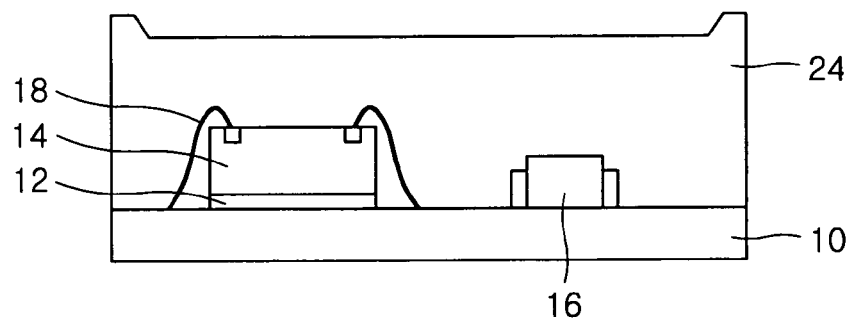
FIG. 2 is a cross-sectional view of a conventional CSP type memory card.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 3:
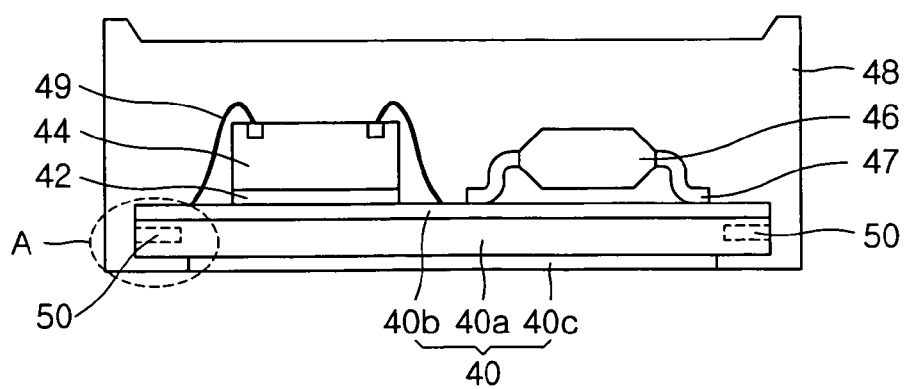
FIG. 3 is a cross-sectional view of a memory card according to an embodiment of the present invention.
Figure 4:
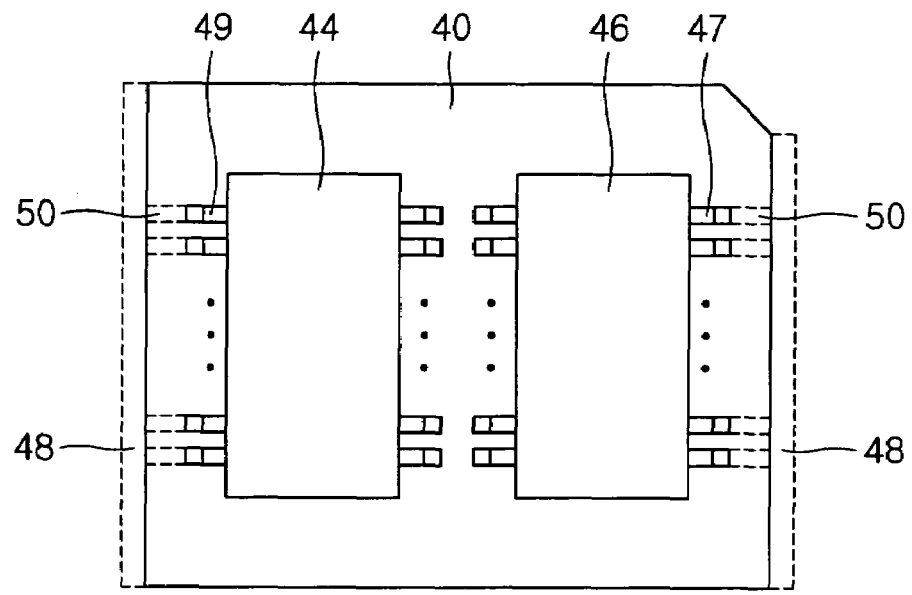
FIG. 4 is a plan view of the memory card shown in FIG. 3.
Figure 5:
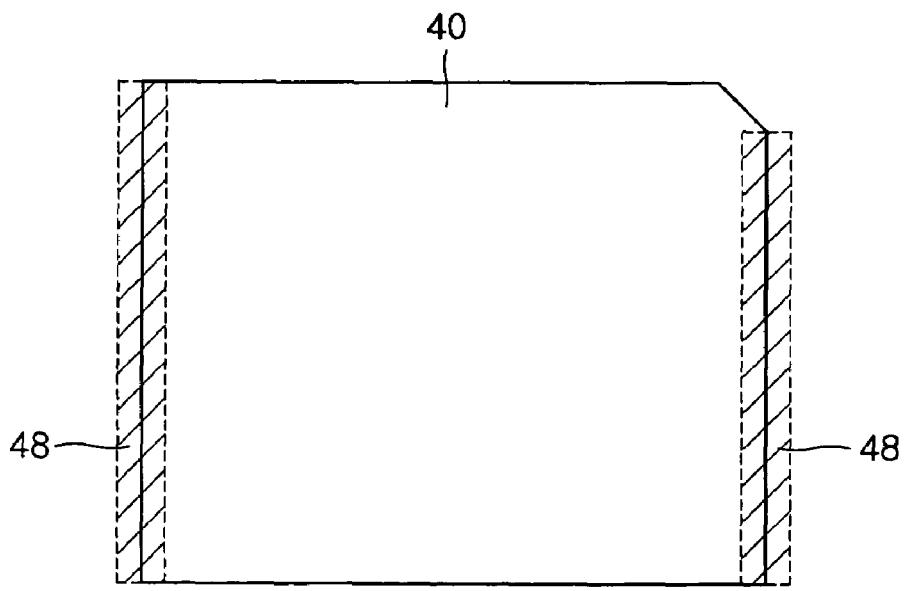
FIG. 5 is a bottom view of the memory card shown in FIG. 3.
Figure 6:
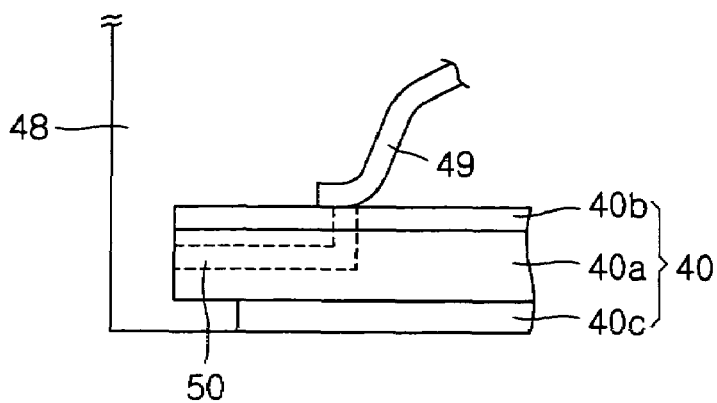
FIG. 6 is an expanded view of portion A shown in FIG. 3.

FIG. 3 is a cross-sectional view of a memory card according to an embodiment of the present invention, FIG. 4 is a plan view of the memory card shown in FIG. 3, FIG. 5 is a bottom view of the memory card shown in FIG. 3, and FIG. 6 is an expanded view of portion A shown in FIG. 3.

Referring to FIGS. 3 through 6, a semiconductor chip 44 is mounted in a predetermined position of a PCB 40 via an adhesive part 42, and an external terminal of the semiconductor chip 44 is electrically connected to a specific circuit terminal formed in the PCB 40 via bonding wires 49. A semiconductor package 46 is mounted in a specific position of the PCB 40 so as to be electrically connected to a specific circuit terminal in the PCB 40 via a lead part 47 according to the design.

In the PCB 40, a main board 40a including interconnections formed in advance according to the design is disposed in the center, an upper photo solder resist (PSR) layer 40b is printed on an upper surface of the main board 40a, and a lower PSR layer 40c is printed on a lower surface of the main board 40a. The PSR layer is an invariable ink that is an invariable compound durable to physical and chemical external environments, is coated on a copper foil plated circuit to protect the copper foil plated circuit and to prevent a solder bridge from being generated between circuits in a wave soldering process performed during mounting of an electronic device.

The semiconductor chip 44 may be mounted on a surface of the PCB 40 using a chip-on-board (COB) method and then sealed using an additional molding process. Alternatively, a semiconductor package 46 may be mounted using surface mount technology (SMT), and then a sealing part 48 may be formed using a molding material, i.e., an epoxy molding compound, so as to seal the semiconductor chip 44 and the semiconductor package 46 at a time. The sealing part 48 extends so as to seal an electronic device mounted on the PCB 40, i.e., the semiconductor chip 44 or the semiconductor package 46, and plating wires 50 exposed to an outer wall of the PCB 40.

In other words, to form the PCB 40, a copper foil is compressed on a side or both sides of the main board 40a formed of an insulating plate made of a phenol resin, an epoxy resin, or the like. Next, patterns (wires) are formed according to a designed circuit, and an unnecessary portion is eroded to remove the copper foil. Holes or viaholes and the plating wires 50 are formed to electrically connect leads of several types of electronic parts mounted on the PCB 40. Here, the plating wires 50 are exposed to a marginal side of the PCB 40. The plating wires 50 exposed to the outer environment including moisture deteriorates the ESD characteristic as described in the prior art. Thus, as shown in FIGS. 4 and 5, the exposed portions of the plating wires 50 are sealed by an extended portion of the sealing part 48 so as to be intercepted from the outer environment.

As shown in FIG. 6, the plating wires 50 are exposed to the outer wall of the PCB 40 at which the sealing part 48 extends. Also, a portion of the lower PSR layer 40c is removed along the edge of the outer wall of the PCB 40 so as to have a predetermined width. The sealing part 48 extends to fill the removed portion of the lower PSR layer 40c. In general, the outer wall of the PCB 40 is molded using a molding material instead of capping a portion of the PCB 40 during a molding process of molding an outer round of a memory card in the manufacture of the memory card. Here, a mold flash is generated below a sidewall of the PCB 40 to cause the badness of the external appearance of the memory card. Thus, if the lower PSR layer 40c is removed by a predetermined width along a lower edge of the PCB 40 prior to the molding process to secure a space, and then the molding process is performed, the mold flash may flow into the space to prevent the badness of the external appearance of the memory card due to the mold flash.

Figure 7:
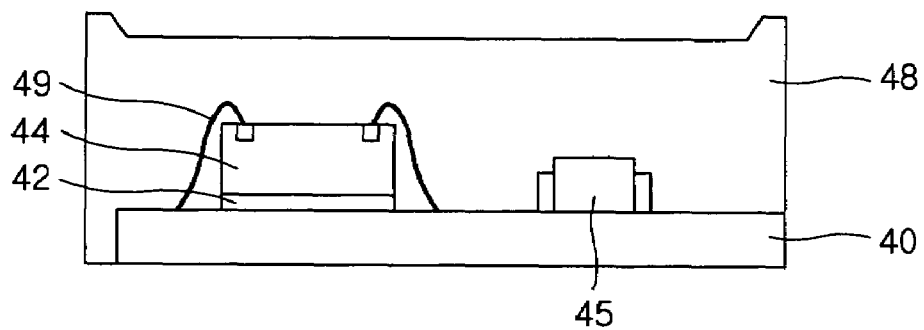
FIG. 7 is a cross-sectional view of a memory card according to another embodiment of the present invention.
Figure 8:
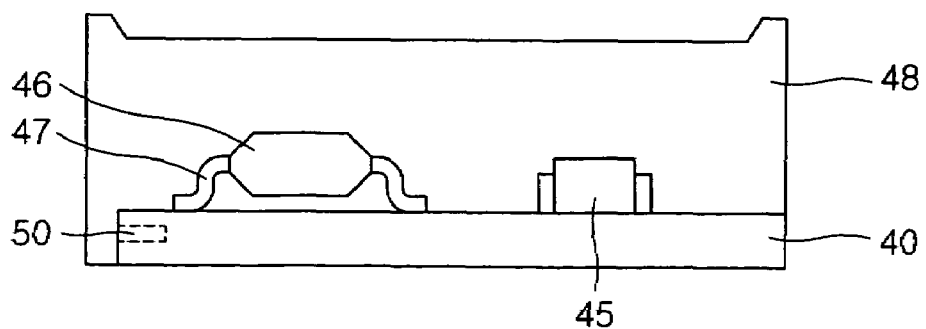
FIG. 8 is a cross-sectional view of a memory card according to still another embodiment of the present invention.

Electronic devices may be mounted on the PCB 40 in various shapes. FIG. 7 is a cross-sectional view of a memory card according to another embodiment of the present invention. In the memory card, the semiconductor chip 44 is mounted on the PCB 40 using the COB method. Also, a molding part 48 is formed to be extended at a portion of the outer wall of the PCB 40 to which conductive wires (not shown) are exposed. FIG. 8 is a cross-sectional view of a memory card according to still another embodiment of the present invention. In the memory card, the semiconductor package 46 is mounted on the PCB 40 using the SMT. Also, the molding part 48 extends along the outer wall of the PCB 40 to which conductive wires 50 are exposed. Also shown in FIGS. 7 and 8 is a passive device 45.

In the memory card shown in FIG. 3, the semiconductor chip 44 may be mounted using the COB method, and the semiconductor package 46 may be mounted using the SMT.

Figure 9:
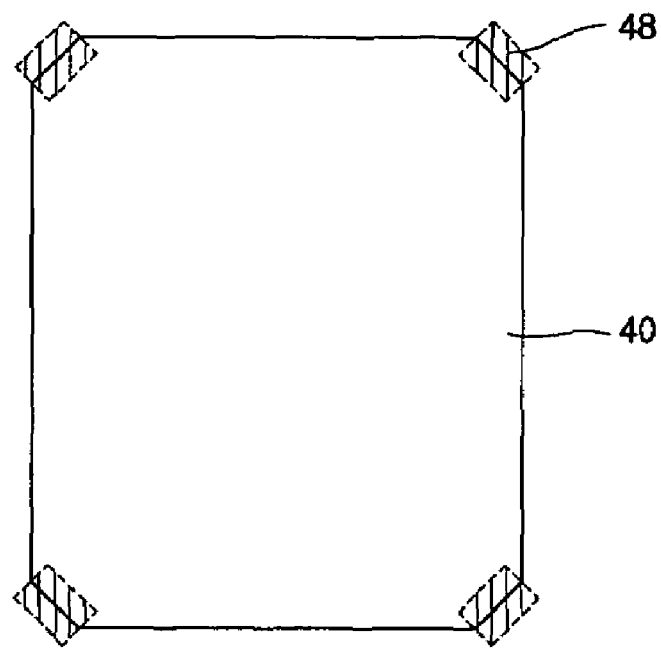
FIG. 9 is a schematic bottom view of a memory card according to yet another embodiment of the present invention.
Figure 10:
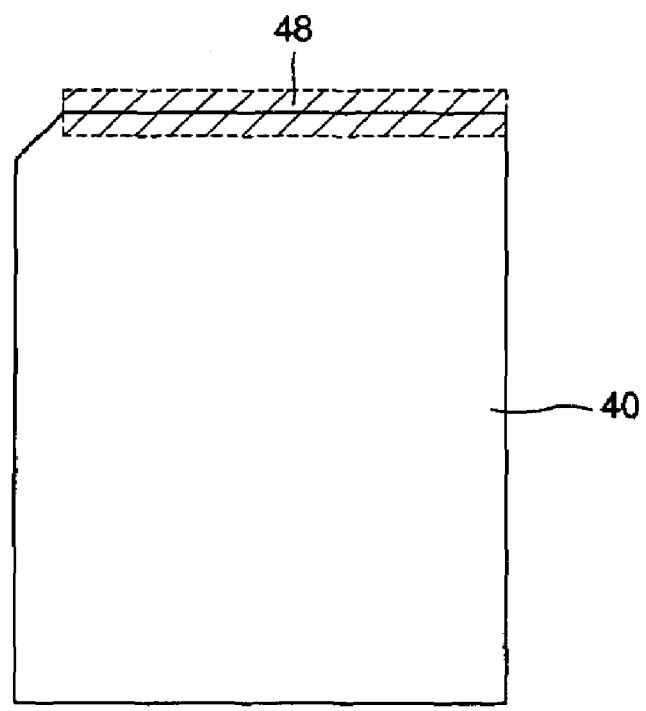
FIG. 10 is a schematic bottom view of a memory card according to yet another embodiment of the present invention.

The conductive wires exposed to the outer wall of the PCB 40 may concentrate on opposite two sides of the outer wall of the PCB 40 as shown in FIG. 5 or may concentrate on slanting sides of corners of the outer wall of the PCB 40 as shown in FIG. 9. The conductive wires may concentrate on a side of the outer wall of the PCB 40 as shown in FIG. 10 or may concentrate at a corner of the outer wall of the PCB 40 as shown in FIG. 11. Referring to FIGS. 9 through 11, a hatched portion of the molding part 48 denotes an extended portion of the molding part 48 sealing exposed conductive wires in a memory card and a portion of the molding part 48 filling a removed portion of the lower PSR layer 40c of the PCB 40.

A method of fabricating a memory card according to an aspect of the present invention will now be described in brief. A PCB including conductive wires exposed to at least a portion of an outer wall of the PCB is provided. Next, at least one electronic device is mounted on the PCB using various known techniques. A molding part is formed to seal the at least one electronic device on the PCB and the conductive wires exposed to an outer wall of the PCB, and to expose at least a portion of the outer wall of the PCB.

In a method of fabricating a memory card according to another aspect of the present invention, a PCB is provided. The PCB includes a main board, an upper PSR layer formed on an upper surface of the main board, and a lower PSR layer formed on a lower surface of the main board. Next, the PSR layer is removed from an edge of a lower surface of the PCB by a predetermined width. Thereafter, at least one electronic device is mounted on the PCB and sealed, and a sealing part is formed to be extended so as to seal the at least one electronic device on the PCB and fill the removed portion of the lower PSR layer of the PCB.

As described above, in a memory card and a method of fabricating the memory card according to the present invention, a lid of the memory card is not formed. Thus, a number of processes of fabricating the memory card can be reduced. Also, the memory card can be fabricated as a CSP type in which an outer side of the PCB is exposed except a portion extended to seal the conductive wires. Thus, cost can be reduced. In addition, an effective area of the PCB can be minimized. Moreover, a space for mounting an electronic device can be maximized to pursue the high integration of the memory card. Furthermore, a sealing part can seal the conductive wires exposed to the outer wall of the PCB. As a result, an ESD characteristic can be prevented from being deteriorated due to the external environment including moisture and the like.

While the present invention has been particularly shown and described with reference to exemplary embodiments thereof, it will be understood by those of ordinary skill in the art that various changes in form and details may be made therein without departing from the spirit and scope of the present invention as defined by the following claims. In other words, a memory card according to the present invention may be formed as a CSP type in which a molding part may be formed to be extended at an outer wall of a PCB to which at least conductive wires are exposed but may not mold the outer wall of the PCB.

What is claimed is:

1. A memory card comprising:
    a printed circuit board comprising conductive wires exposed to at least a portion of an outer wall of the printed circuit board;
    at least one electronic device mounted on the printed circuit board; and
    a molding part sealing the at least one electronic device on the printed circuit board, completely sealing the conductive wires exposed to the outer wall of the printed circuit board, and simultaneously exposing at least a portion of the outer wall of the printed circuit board, wherein the printed circuit board comprises: a main board; a lower photo solder resist layer formed on a lower surface of the main board; and an upper photo solder resist layer formed on an upper surface of the main board, wherein a portion of the lower photo solder resist layer is removed, and the molding part is formed to be extended to the removed portion of the lower photo solder resist layer.

2. The memory card of claim 1, wherein the printed circuit board is square, and the conductive wires are exposed to at least one side of the outer wall of the printed circuit board.

3. The memory card of claim 1, wherein the printed circuit board is square, and the conductive wires are exposed to at least one corner of the outer wall of the printed circuit board.

4. The memory card of claim 1, wherein the printed circuit board is square, and the conductive wires are exposed to at least one side and at least one corner of the outer wall of the printed circuit board.

5. The memory card of claim 1, wherein the at least one electronic device is one of a semiconductor chip and a semiconductor package.

6. The memory card of claim 1, wherein the at least one electronic device is mounted on an upper surface of the printed circuit board and wherein the upper surface and outer wall of the printed circuit board share a common edge.

7. A memory card comprising:
    a printed circuit board comprising a main board including conductive wires exposed to at least a portion of an outer wall of the main board, an upper photo solder resist formed on an upper surface of the main board, and a lower photo solder resist layer formed on a lower surface of the main board, a portion of the lower photo solder resist being removed from a lower surface of the main board;
    at least one electronic device mounted on the printed circuit board; and
    a sealing part completely sealing the conductive wires and sealing the at least one electronic device on the printed circuit board and extending to fill the removed portion of the lower photo solder resist layer of the printed circuit board.

8. The memory card of claim 7, wherein an edge region of the lower surface of the main board is exposed by the removed portion of the lower photo solder resist layer, the edge region of the lower surface of the main board having a predetermined width and extending from an edge of the lower surface of the main board.

9. The memory card of claim 8, wherein a length of the edge region of the lower surface of the main board is equal to a length of the edge of the lower surface of the main board.

10. The memory card of claim 7, wherein the conductive wires are exposed to an outer wall of the main board and the molding part completely seals the conductive wires.

11. The memory card of claim 10, wherein an edge region of the lower surface of the main board is exposed by the removed portion of the lower photo solder resist layer, the edge region of the lower surface of the main board extending from an edge defined by the lower surface of the main board and the outer wall of the main board.

12. The memory card of claim 9, wherein a portion of the lower photo solder resist layer is removed by a predetermined width along at least one corner of the lower surface of the printed circuit board.

13. The memory card of claim 7, wherein the conductive wires are exposed to a corner of an outer wall of the main board of the printed circuit board at the removed portion of the lower photo solder resist layer, and the molding part seals the conductive wires.

14. The memory card of claim 7, wherein the lower photo solder resist layer of the printed circuit board is removed from at least one side and at least one corner of the printed circuit board.

15. The memory card of claim 14, wherein the conductive wires are exposed to a side and a corner of an outer wall of the main board at the removed portion of the lower photo solder resist layer of the printed circuit board, and the molding part seals the conductive wires.

16. The memory card of claim 7, wherein the at least one electronic device is one of a semiconductor chip and a semiconductor package.

17. A method of fabricating a memory card comprising:
providing a printed circuit board comprising conductive wires exposed to at least a portion of an outer wall of the printed circuit board;
mounting at least one electronic device on the printed circuit board; and
forming a molding part sealing the at least one electronic device on the printed circuit board, completely sealing the conductive wires exposed to the outer wall of the printed circuit board and exposing at least a portion of the outer wall of the printed circuit board, wherein the printed circuit board comprises: a main board; a lower photo solder resist layer formed on a lower surface of the main board; and an upper photo solder resist layer formed on an upper surface of the main board, wherein a portion of the lower photo solder resist layer is removed, and the molding part is formed to be extended to the removed portion of the lower photo solder resist layer.

18. The method of claim 17, wherein the at least one electronic device is one of a semiconductor chip and a semiconductor package.

19. The method of claim 17, wherein mounting the at least one electronic device comprises mounting the at least one electronic device on an upper surface of the printed circuit board and wherein the upper surface and outer wall of the printed circuit board share a common edge.

20. A method of fabricating a memory card comprising:
providing a printed circuit board comprising a main board including conductive wires exposed to at least a portion of an outer wall of the main board, an upper photo solder resist layer formed on an upper surface of the main board, and a lower photo solder resist layer formed on a lower surface of the main board;
removing a portion of the lower photo solder resist layer from a lower surface of the main board;
mounting at least one electronic device mounted on the printed circuit board; and
forming a sealing part completely sealing the conductive wires and sealing the at least one electronic device on the printed circuit board and extending to fill the removed portion of the lower photo solder resist layer of the printed circuit board.

21. The method of claim 20, wherein an edge region of the lower surface of the main board is exposed upon removing the portion of the lower photo solder resist layer, the edge region of the lower surface of the main board having a predetermined width and extending from an edge of the lower surface of the main board.

22. The method of claim 21, wherein a length of the edge region of the lower surface of the main board is equal to a length of the edge of the lower surface of the main board.

23. The method of claim 20, wherein the conductive wires are exposed to an outer wall of the main board, wherein the edge region of the lower surface of the main board extends from an defined by the lower surface of the main board and the outer wall of the main board and wherein the sealing part completely seals the conductive wires.

24. The method of claim 20, wherein the at least one electronic device is one of a semiconductor chip and a semiconductor package.

25. A memory card comprising:
a printed circuit board, the printed circuit board including a mounting surface, a plurality of sidewalls, and a conductive wire, wherein the plurality of sidewalls include at least one first sidewall extending from the mounting surface in a different plane from the mounting surface and at least one second sidewall, and wherein the conductive wire is exposed to at least one first sidewall;
at least one electronic device mounted to the mounting surface of the printed circuit board; and
an encapsulant sealing the at least one electronic device on the mounting surface and covering the at least one first sidewall, wherein
the encapsulant comprises molding material,
the at least one second sidewall is exposed by molding material, and
the encapsulant completely seals the conductive wire,
wherein the printed circuit board comprises:
a main board;
a lower photo solder resist layer formed on a lower surface of the main board; and
an upper photo solder resist layer formed on an upper surface of the main board,
wherein a portion of the lower photo solder resist layer is removed, and the molding part is formed to be extended to the removed portion of the lower photo solder resist layer.

26. The memory card of claim 25, wherein the printed circuit board comprises an equal number of first sidewalls and second sidewalls.

27. The memory card of claim 25, wherein the printed circuit board comprises more second sidewalls than first sidewalls.

28. The memory card of claim 27, wherein the printed circuit board comprises one first sidewall.

29. A method of fabricating a memory card, the method comprising:
providing a printed circuit board, the printed circuit board including a mounting surface, a lower surface opposite the mounting surface, at least one first sidewall extending from the mounting surface to the lower surface, a plurality of second sidewalls and a conductive wire exposed to the at least one first sidewall;
providing at least one electronic device mounted to the mounting surface of the printed circuit board; and
providing an encapsulant sealing the at least one electronic device on the mounting surface and covering the at least one first sidewall, wherein
the encapsulant comprises molding material,
the plurality of second sidewalls are exposed by molding material, and
the encapsulant completely seals the conductive wire,
wherein the printed circuit board comprises:
　a main board;
　a lower photo solder resist layer formed on a lower surface of the main board; and
　an upper photo solder resist layer formed on an upper surface of the main board,
　wherein a portion of the lower photo solder resist layer is removed, and the molding part is formed to be extended to the removed portion of the lower photo solder resist layer.

30. The method of claim 29, wherein the printed circuit board comprises an equal number of first sidewalls and second sidewalls.

31. The method of claim 29, wherein the printed circuit board comprises more second sidewalls than first sidewalls.

32. The method of claim 31, wherein the printed circuit board comprises one first sidewall.

* * * * *

UNITED STATES PATENT AND TRADEMARK OFFICE
CERTIFICATE OF CORRECTION

| | | |
|---|---|---|
| PATENT NO. | : 7,589,405 B2 | Page 1 of 1 |
| APPLICATION NO. | : 11/286058 | |
| DATED | : September 15, 2009 | |
| INVENTOR(S) | : Min-Young Son et al. | |

It is certified that error appears in the above-identified patent and that said Letters Patent is hereby corrected as shown below:

Column 7, line 10, the words "claim 9," should read -- claim 8, --.

Signed and Sealed this

Eighth Day of December, 2009

David J. Kappos
*Director of the United States Patent and Trademark Office*